United States Patent [19]

Worns et al.

[11] Patent Number: 4,547,453

[45] Date of Patent: Oct. 15, 1985

[54] COMPRESSIBLE PHOTOPOLYMER PRINTING PLATE

[75] Inventors: John R. Worns; James W. Chase, both of Mishawaka; Bruce W. Capriotti, South Bend, all of Ind.

[73] Assignee: Uniroyal, Inc., Middlebury, Conn.

[21] Appl. No.: 554,039

[22] Filed: Nov. 21, 1983

Related U.S. Application Data

[63] Continuation-in-part of Ser. No. 230,926, Feb. 2, 1981, abandoned.

[51] Int. Cl.$^4$ ............................................. G03C 1/24
[52] U.S. Cl. .................................. 430/271; 430/276; 430/155; 430/523
[58] Field of Search ............... 430/271, 276, 155, 523; 101/395, 401.1, 376, 379; 428/319.1, 319.3, 319.7, 318.4

[56] References Cited

U.S. PATENT DOCUMENTS

| | | | |
|---|---|---|---|
| 3,663,289 | 5/1972 | Newman | 430/302 |
| 4,042,743 | 8/1977 | Larson | 428/246 |
| 4,112,841 | 9/1978 | Deshpande | 101/376 |
| 4,162,919 | 7/1979 | Richter et al. | 430/271 |
| 4,211,808 | 7/1980 | Trankle | 430/523 |
| 4,234,640 | 11/1980 | Wittel | 101/395 |
| 4,264,705 | 4/1981 | Allen | 430/271 |

FOREIGN PATENT DOCUMENTS

| | | | |
|---|---|---|---|
| 2607479 | 2/1975 | Fed. Rep. of Germany | 430/271 |
| 1358062 | 6/1974 | United Kingdom | 430/270 |
| 1395822 | 5/1975 | United Kingdom | 430/270 |

*Primary Examiner*—Won H. Louie
*Attorney, Agent, or Firm*—John A. Shedden

[57] ABSTRACT

A layered sheet construction suitable after processing for use as a relief printing plate is provided. The sheet is made of a photosensitive layer comprising an elastomeric polymer, between about 5 and 30 phr of an ethylencially unsaturated compound and between 0.1 and 5 phr of a photoinitiator activatable by actinic radiation; a base layer immediately adjacent to said photosensitive layer capable of supporting a relief image after processing; having the same or a different composition than said photosensitive layer. The sheet is bonded to an open or closed cell foam layer having a thickness between about 0.010 inch and 0.250 inch. Said foam has a recovery rate of at least 80%, a compression value between about 0.003 inch and 0.030 inch and a density of between about 2 to 50 lbs/ft$^3$ and is bonded to a dimensionally stable supporting layer.

9 Claims, No Drawings

COMPRESSIBLE PHOTOPOLYMER PRINTING PLATE

This application is a continuation-in-part of application Ser. No. 230,926 filed Feb. 2, 1981, abandoned.

The present invention relates to a sheet containing a photopolymer, monomer and initiator suitable for use as a flexographic relief printing plate having a soft image layer, which sheet is bonded to a compressible foam material which is in turn bonded to a dimensionally stable backing material. The total thickness of the plate is at least 0.060".

DESCRIPTION OF THE PRIOR ART

U.S. Pat. Nos. 2,760,863; 3,024,180; 3,261,686 and 3,764,324 describe soft and hard, flexible and rigid photopolymer compositions in sheet form that are imaged and processed to finished relief printing plates. None of the processes disclosed therein involves the incorporation of a compressible foam layer into the sheet to produce a compressible relief printing plate.

U.S. Pat. No. 4,042,743 discloses a process to produce a compressible offset printing blanket by the incorporation of resin microballoons into the blanket thereby forming a compressible layer.

One technique which is known to produce a compressible layer in offset blankets is to incorporate air into the blanket cement followed by vulcanization to the blanket face. Another technique is to impregnate a highly porous felted fibrous web with an elastomeric material in solution followed by vulcanization.

U.S. Pat. No. 4,112,841 discloses a lithographic printing plate with a very thin compressible or incompressible layer and a hard image layer. This printing plate has a total thickness of 0.0117" and has a resilient layer of 0.008" or less in thickness. This patent teaches the use of polystyrene or polyurethane foams for the compressible resilient layer. Polystyrene foam is a rigid foam material and would tend to permanently deform upon impact thereby not giving the advantage of a compressible layer. Polyurethanes foams in a thickness of 0.008" would be totally ineffective in a construction of the present invention since such a layer would have less resilience than the soft elastomeric face layer due to the necessarily small micro bubbles in such a then foam layer. The ratio of the thickness of the image layer to the thickness of the foam layer is from 5:1 to 140:1.

None of these methods describes the incorporation of a compressible layer onto the sheet material used to form the photopolymer flexographic printing plate such that the sheet can be exposed and processed to a finished printing plate that uses a soft image layer, exhibits compressibilty during printing and permits wide impression latitude. Such a wide impression latitude permits the printing of uneven substrates, and the use of presses with lower accuracy in the press cylinders without adversely affecting print quality. The incorporation of an integral compressible layer into the sheet avoids the problems of mounting of flexographic plates on compressible foam tapes. This mounting technique has the problem of the tape stretching during mounting, the tearing of the tape when the plates are positioned and repositioned during plate registration. The aforesaid foam tape mounting technique also has the problem of the tape tearing when plates are demounted and remounted for repeated use. The use of an integral foam backed photopolymer plate in accordance with the present invention permits the use of a much wider range of properties of the compressible layer compared to foam mounting tapes because the integral foam is not subject to the stretching and tearing that foam mounting tapes must resist.

Compressible printing plates of the type manufactured and used pursuant to the present invention are particularly useful in:

A. printing on wide webs (films of cellophane, polyethylene, polypropylene, polyester, vinyl and paper where web thickness is in the range of about ½ to 5 mils. In wide web printing roll, sag and distortion and machine gauge variation are overcome by the compressibility of foam.
B. printing on corrugated carboard where compressibility in foam allows the plate to apply constant pressure to uneven surfaces giving an even ink laydown for uniform print.
C. printing safety papers (checks, bond and stock forms) with even uniform constant tone in background print.
D. process printing (4 color printing) where uniformity of ink laydown is critical to proper color development.

A compressible plate also has longer life. The mechanical shock to the plate, in each print motion, causes a gradual wearing of the relief, gradually leading to loss of sharpness in print. Compressible foam absorbs the mechanical shock leaving the relief printing surface relatively unaffected (minimal flattening or distortion) resulting in longer plate life.

The use of an integral foam backed photopolymer plate also permits the use of photographic pin registration systems which permit pre-registration of multiple plate images (as used in multi-color printing). This allows rapid and in most cases instant registration of multiple plates when mounted on presses as with most photopolymer plates. The unique feature of this invention is that these pin registration systems may now be used with a plate that has the advantages of a compressible backing. This is impossible with foam mounting tapes.

DESCRIPTION OF THE INVENTION

As in the typical flexographic photopolymer printing plate, the plate of the present invention combines three elements:

1. A relief or image layer which is sensitive to ultraviolet light.
2. A backing layer which may or may not be sensitive to ultraviolet light that is used to build the relief layer to the proper printing height.
3. A dimensionally stable backing layer that supports the layers described above and prevents dimensional changes in the plate images which would adversely affect the printing ability of the plate.

These layers are laminated to form a sheet. To convert the sheet into a flexographic printing plate, the image layer is covered by a black and transparent film of the desired printing copy, and exposed to actinic (usually ultraviolet) radiation through the transparency. The light which passes through the transparent portions causes polymerization or crosslinking of the photopolymer that causes insolubilization of the exposed areas. After irradiation, the sheet is washed with a solvent (usually a halogenated hydrocarbon) which removes the unexposed soluble areas of the plate. After oven drying, the sheet is now a rubber printing plate.

The present invention involves a plate having a thickness of at least 0.08" and the addition of a fourth element to the photopolymer printing plate between the second and third layers described above. This layer consists of an open or closed cell foam with a density of 2 to 50 pounds per cubic foot in a thickness of 0.010" to 0.250" depending on the thickness of the plate needed. This element is applied to the image layer via lamination of the foam to said layer as described hereinafter.

In order for the plates of the present invention to be used effectively in the applications listed above, a suitable amount of foam should be present in the plate. For example, if the total plate thickness is less than 0.100", the preferable foam thickness in said plate should be about 0.02". If the total plate thickness is between about 0.100" and 0.170", the preferable foam should be about 0.04". If the total plate thickness is greater than 0.170" up to about 0.250", the preferable foam thickness should be about 0.080".

The foam used should possess a good recovery rate, compression value and appropriate density for the end use.

The recovery rate of the foam is measured by determining the percent of the original foam thickness that the foam returns to in a given unit of time after compression. In the instant case, 25 p.s.i. is applied for ten seconds via a one-half inch diameter plate on the sample. The plate is removed and the foam sample is allowed to recover for ten seconds. The foam is then measured and the percentage of recovery calculated. The foam used in accordance with the present invention (for all thicknesses) should possess the property that the percent of the original thickness recovered at the end of ten seconds after 25 p.s.i. for ten seconds should be 80% or greater, preferably greater than 92%.

The compression value of the foam is obtained using the recovery rate method described above.

The value in thousandths of an inch is obtained by measuring the extent that the foam remains compressed after ten seconds of the aforesaid pressure.

The compression and density values are set forth in Table 1 below:

TABLE 1

| Total Plate Thickness (inch) | 0.040–0.100 | 0.100–0.170 | 0.170–0.250 |
| --- | --- | --- | --- |
| Foam Thickness (inch) | 0.020 | 0.040 | 0.080 |
| Foam Compression (inch) - | | | |
| Preferred | 0.003 | 0.010 | 0.020 |
| Maximum | 0.005 | 0.020 | 0.030 |
| Density (lbs./ft$^3$) | 30 | 20 | 20 |

Preferred foams are all closed cell with *no* skin such as: vinyl, polyurethane, EPDM and polyolefin. The foams must be compatible with solvents used, e.g., not dissolved, weakened swelled, etc.

The foam layer is provided with adhesive on both sides of the foam. This adhesive must be in a smooth glassy finish to provide a solvent impermeable bond to the smooth glassy polyester or metal backing and the smooth glassy photopolymer. Use of a matte finish on the photopolymer, foam adhesive or metal backing which results in less than intimate contact between the surfaces will result in solvent attack during plate washout with resultant delamination of the photopolymer, foam and backing. This would then necessitate the use of solvent resistant adhesives which are difficult to apply. The foam layer is first applied to a dimensionally stable supporting layer.

The photopolymer with or without the carrier backing is pre-back-exposed to ultraviolet light with the normal amount of back exposure used for the plate thickness being used so that the resulting base formed can support a relief image after processing. If the carrier backing is used, it is now stripped from the plate.

The pre-exposed photopolymer without the carrier backing is then laminated to the foam with dimensionally stable backing to produce an integral compressible photopolymer plate material that can be processed normally to a finished compressible photopolymer plate.

The relief or soft image layer mentioned above is a blend of a photopolymer, between about 5 and 30 phr of an ethylenically unsaturated monomer and between 0.1 and 5 phr of a photoinitiator sensitive to actinic radiation. The image layer has a Young's modulus of elasticity of 100–1000 psi at 300%. Preferred compositions and methods of preparing same as used in this layer are disclosed in United Kingdom Pat. Nos. 1,358,062 and 1,395,822, and U.S. patent application Ser. No. 96,608 filed Nov. 21, 1968, the contents of which are hereby incorporated by reference herein.

Preferred ethylenically unsaturated monomers used herein are: trimethylolpropane triacrylate, pentaerythritol tetraacrylate, 1,6-hexanediol diacrylate, triacrylate of isocyanurate, dipentaerythritol monohydroxypentaacrylate, trimethylolpropane ethoxylate triacrylate.

Preferred photoinitiators are: benzophenone, 2,2-dimethoxy-2-phenylacetophenone, isobutyl benzoin ether, benzoin methyl ether and 2,2-diethoxyacetophenones.

In this invention any photopolymer can be used as long as it can be produced with no backing. The unbacked material is preferred with a smooth glassy surface for easy bonding to the foam; however, other methods of bonding are possible. It is also preferred that the photopolymer be capable of holding its back exposure or not require a back exposure to facilitate maximum detail reproduction of the photopolymer plate material. Also the preferred photopolymer should be extensible enough to allow the construction to be flexible enough to be wrapped around small diameter (1 to 6 inch) plate cylinders without buckling. Preferred also is a dimensionally stable polymer which will not shrink on face exposure facilitating its use in close plate-to-plate registration printing as required in four color process printing.

In this invention the preferred method of bonding is by the use of highly tacky adhesives or adhesive tapes; however, other bonding is not excluded, such as urethane, epoxy, cyanoacrylate, anaerobic or hot melt bonding. These methods should, of course, preferably produce a flexible construction.

FIG. 1 depicts a side view of the various layers of the sheet construction after assembly. The base area depicted may have the same composition as and be homogeneous with the polymer layer or it may be a separate layer with a different composition. The base layer is present to support the printing relief images present after exposure and washout of the plate. The total thickness of all the layers is at least 0.06".

The following examples are presented by way of illustration and are not to be construed as limiting the scope of the invention.

EXAMPLE I

A plate was formed using the following materials:

Photopolymer sheet 0.080" (butadiene-acrylonitrile rubber (NBR), acrylate monomer and benzophenone at 100:20:2 ratio)

Two sided close cell vinyl foam tape 0.043"

0.005" Polyester Film

The photopolymer sheet (0.075") which is contained between two protective polyester sheets (0.005") is pre-back-exposed for one minute with ultraviolet radiation. The protective backing polyester sheet is removed leaving intact the protective cover sheet which contains a transferable 0.0002" thick release film. The 0.043" tape supported with a silicone coated polyester film is laminated via a two-roll laminator (set at a 0.046" gap) to the 0.005" polyester film. The gap of the two roll laminators is reset to 0.120". The release polyester film is removed from the vinyl foam bonded to the 0.005" polyester backing. This is then passed thru the laminator nip with the unbacked pre-exposed photopolymer. The finished laminate is heated to 150° F. for 20 minutes to stress relieve the photopolyer. It is then cooled. This produces a sheet of integrally compressible photopolymer material 0.125" thick ready for customer imaging.

The unexpected and unique feature of this plate is its ability to tolerate wide impression changes (±0.020"), when printing, without complete destruction of the plate or the print quality. This eliminates press bounce and haloing normally associated with high impression (0.005" to 0.015") in flexo printing. It also permits the use of presses with inaccurate press cylinders and bearings and allows substrates with poor gauge tolerance (±0.005") to be readily printed with good quality.

The NBR suitable for use pursuant to the present invention contains 2 to 50% by weight copolymerized acrylonitrile.

EXAMPLE II

Using the procedure outlined in Example I an unbacked photopolymer sheet (0.065") styrene-butadiene-styrene block copolymer comprising acrylate, monomer and benzophenone at a 100:10:2 ratio, is spray coated with a hot melt adhesive dissolved in a suitable solvent. The hot melt adhesive is a low temperature activated type (150°-170° F.). A polyester backing film (0.005") is also spray coated with this adhesive.

A closed cell PVC foam sheet (0.040" thick) and the adhesive coated polyester sheet are then heated to 160° F. in a forced air oven for two minutes. They are then removed and quickly bonded together via a two roll laminator as described in Example I. The foam and backing are again heated along with the unbacked adhesive coated photopolymer in the forced air oven at 150° for 2 minutes. They are removed and bonded together via the two roll laminator.

This compressible photopolymer sheet is imaged by exposure to ultraviolet light thru a photographic negative and washout in perchloroethylene.

EXAMPLE III

Using the procedure described in Example II, a solvent based two component urethane adhesive was substituted for the hot melt adhesive. The adhesive was allowed to dry until tacky and then bonded without the need for heat.

EXAMPLE IV

Using the procedures outlined in Example I, an unbacked photopolymer sheet comprising styrene-isoprene-styrene block copolymer, methacrylate monomer and benzophenone at a 100:10:2 ratio was used. A 0.080" two sided foam tape was bonded to a polyester backing (0.005"). This was in turn bonded to the unbacked 0.175" photopolymer sheet described above. This produces a 0.250" thick integrally compressible photopolymer sheet that is imaged to a finished compressible photopolymer plate as described in Example II.

What we claim and desire to protect by Letters Patent:

1. A layered sheet construction suitable after processing for use as a relief printing plate having a thickness of at least 0.08 inch comprising
   (A) a photosensitive image layer having a 300% modulus of elasticity of 100–1000 psi comprising 100 parts elastomeric polymer, 5 to 30 parts ethylenically unsaturated compound and 0.1 to 5 parts photoinitiator activatable by actinic radiation, all by weight; bonded to
   (C) a foamed poly(vinylchloride) layer having a thickness of 0.020–0.150 inch, a recovery rate of at least 80%, a compression value of 0.003–0.030 inch and a density of 10–40 lbs/ft$^3$; bonded to
   (D) a dimensionally stable supporting layer.

2. The sheet construction of claim 1 wherein between (A) and (C) there is a base layer (B) capable of supporting a relief image after processing which may be the same or a different composition from (A).

3. The sheet construction defined in claim 2 wherein the elastomeric polymer is selected from the group consisting of butadiene acrylonitrile rubber, styrene-isoprene-styrene block copolymer, styrene-butadiene-styrene block copolymer and chloro sulfonated polyethylene.

4. The sheet construction defined in claim 2 wherein the ethylenically unsaturated compound is selected from the group consisting of:
   (A) trimethylolpropane triacrylate,
   (B) pentaerythritol tetraacrylate,
   (C) 1,6-hexanediol diacrylate,
   (D) triacrylate of (tris 2-hydroxyethyl)isocyanurate,
   (E) dipentaerythritol monohydroxypentaacrylate,
   (F) trimethylolpropane ethoxylate triacrylate,
   (G) 1,6-hexanediol dimethacrylate.

5. The sheet construction defined in claim 2 wherein the photoinitiator activatable by actinic radiation is selected from the group consisting of:
   (A) benzophenone
   (B) 2,2-dimethoxy-2-phenylacetophenone
   (C) isobutyl benzoin ether
   (D) benzoin methyl ether and
   (E) 2,2-diethoxyacetophenone.

6. The sheet construction defined in claim 2 wherein the foam has a recovery rate of about 92% and a density between 20 and 30 lbs/ft$^3$.

7. The sheet construction defined in claim 2 wherein the elastomeric polymer is selected from the group consisting of:
   (A) butadiene acrylonitrile rubber,
   (B) styrene-isoprene-styrene block polymer,
   (C) styrene-butadiene-styrene block copolymer and
   (D) chloro sulfonated polyethylene;

the ethylenically unsaturated compound is selected from the group consisting of:
(A) trimethylolpropane triacrylate,
(B) pentaerythritol tetraacrylate,
(C) 1,6-hexanediol diacrylate,
(D) triacrylate of (tris 2-hydroxyethyl)isocanurate,
(E) dipentaerythritol monohydroxypentaacrylate,
(F) trimethylolpropane ethoxylate triacrylate, and
(G) 1,6 hexanediol dimethacrylate;
the photoinitiator is selected from the group consisting of:
(A) benzophenone,
(B) 2,2-dimethoxy-2-phenylacetophenone,
(C) isobutyl benzoin ether,
(D) benzoin methyl ether and
(E) 2,2-diethoxyacetophenone.

8. The sheet construction defined in claim 7 wherein the photosensitive layer comprises a butadiene-acrylonitrile rubber, trimethylol propane triacrylate and benzophenone, at a ratio of 100:20:2, and the foam having a density of 18 to 30 pounds per cubic foot, with a backing of polyester film or a thin steel sheet.

9. The sheet construction defined in claim 7 wherein the photosensitive layer comprises a styrene-isoprene-styrene block copolymer, 1,6-hexanediol diacrylate and 2,2-dimethoxy-2-phenylacetophenone at a ratio of 100:10:2, and the foam having a density of 18 to 30 pounds per cubic foot, with a backing of a polyester film or a thin steel sheet.

* * * * *